United States Patent
Cai et al.

(10) Patent No.: US 9,292,054 B2
(45) Date of Patent: Mar. 22, 2016

(54) POWER SUPPLY MODULE AND SERVER HAVING THE SAME

(71) Applicant: Wistron Corporation, New Taipei (TW)

(72) Inventors: Xiao-Yi Cai, New Taipei (TW); Chong-Xing Zhu, New Taipei (TW)

(73) Assignee: Wistron Corporation, New Taipei (TW)

( * ) Notice: Subject to any disclaimer, the term of this patent is extended or adjusted under 35 U.S.C. 154(b) by 309 days.

(21) Appl. No.: 14/073,888

(22) Filed: Nov. 7, 2013

(65) Prior Publication Data

US 2014/0160652 A1    Jun. 12, 2014

(30) Foreign Application Priority Data

Dec. 12, 2012 (CN) .......................... 2012 1 0535940

(51) Int. Cl.
*H05K 7/00* (2006.01)
*G06F 1/18* (2006.01)
*H05K 7/14* (2006.01)

(52) U.S. Cl.
CPC .............. *G06F 1/188* (2013.01); *H05K 7/1487* (2013.01); *H05K 7/1492* (2013.01)

(58) Field of Classification Search
USPC .......................... 361/728–730, 807, 809, 810
See application file for complete search history.

(56) References Cited

U.S. PATENT DOCUMENTS

| | | | |
|---|---|---|---|
| 6,287,135 B1 * | 9/2001 | Hashiguchi ........... | H01R 13/518 439/310 |
| 8,208,261 B2 * | 6/2012 | Fan ......................... | G06F 1/188 312/223.1 |
| 8,277,229 B2 * | 10/2012 | Chiu ..................... | H01R 12/737 361/785 |
| 8,437,122 B2 * | 5/2013 | Chou ..................... | G06F 1/184 361/679.02 |
| 8,559,189 B2 * | 10/2013 | Li ............................ | G06F 1/188 361/785 |
| 2007/0076380 A1 | 4/2007 | Chang et al. | |
| 2010/0232976 A1 * | 9/2010 | Li ....................... | H05K 7/20172 416/244 R |

FOREIGN PATENT DOCUMENTS

| | | |
|---|---|---|
| TW | M327053 | 2/2008 |
| TW | M366280 | 10/2009 |
| TW | 201210431 | 3/2012 |
| TW | 201225810 | 6/2012 |

OTHER PUBLICATIONS

Office Action of China Counterpart Application with partial English translation, issued on Nov. 27, 2015, p. 1-p. 11, in which the listed reference was cited.

* cited by examiner

*Primary Examiner* — Hung S Bui
(74) *Attorney, Agent, or Firm* — Jianq Chyun IP Office (57) ABSTRACT

A power supply module suitable for a server is provided. The server includes a base and a main board. The main board is disposed on the base. The power supply module includes a frame and a first power connector. The frame is disposed on the base and adjacent to an edge portion of the main board. The first power connector is slidably disposed on the frame. When the first power connector slides to a first position, the first power connector protrudes from the frame and the edge portion of the main board is located between the first power connector and the base. When the first power connector slides to a second position, the first power connector is located in the frame.

21 Claims, 6 Drawing Sheets

POWER SUPPLY MODULE AND SERVER HAVING THE SAME

CROSS-REFERENCE TO RELATED APPLICATION

This application claims the priority benefit of China application serial no. 201210535940.1, filed on Dec. 12, 2012. The entirety of the above-mentioned patent application is hereby incorporated by reference herein and made a part of this specification.

BACKGROUND

1. Technical Field

The disclosure relates to an electronic device and a power supply module thereof. More particularly, the disclosure relates to a server and a power supply module thereof.

2. Description of Related Art

A so-called server is usually utilized, in contemporary computer systems, to effectively provide source management to multiple computer main frames and provide more services to each computer main frame. The server usually has better computing power and bigger data storage space for multiple computer frames to use. Generally speaking, the server has a power supply module to provide powers during operations. Take a rack mountable server as an example, a power supply module thereof can include a main power connector and a backup power connector to enhance stability of providing powers to the server.

Some rack mountable servers fixes a backup power connector on a main board with a fixing stand. However, the fixing stand occupies more disposition space on the main board, and therefore, dispositions of elements on the main board are restricted. Additionally, the backup power connector can also be fixed on a frame of the power supply module. Although such assembling method does not occupy disposition space on the main board, difficulties increase when dissembling the main board because of interference of the backup power connector and the main board. For example, other components (such as a fan module) in the server have to be designed as detachable components, such that the main board has enough space for dissembling via dissemble the component (the fan module). Additionally, some rack mountable servers fix backup power connectors in a detachable way on frames of the power supply module and dissemble the backup power connector from the power supply module first before dissembling the main board, such that the main board has enough space for dissembling. However, such design complicates a dissembling procedure of the main board and causes inconvenience in terms of reworking and maintaining the main board.

SUMMARY

The disclosure provides a power supply module for easily dissembling a main board of a server.

The disclosure provides a server having a power supply module so as to easily dissemble a main board.

The disclosure provides a power supply module suitable for a server. The server includes a base and a main board. The main board is disposed on the base. The power supply module includes a frame and a first power connector. The frame is disposed on the base and adjacent to an edge portion of the main board. The first power connector is slidably disposed on the frame. When the first power connector slides to a first position, the first power connector protrudes from the frame and the edge portion of the main board is located between the first power connector and the base. When the first power connector slides to a second position, the first power connector is located in the frame.

The disclosure provides a server including a base, a main board and a power supply module. The main board is disposed on the base. The power supply module includes a frame and a first power connector. The frame is disposed on the base and adjacent to an edge portion of the main board. The first power connector is slidably disposed on the frame. When the first power connector slides to a first position, the first power connector protrudes from the frame and the edge portion of the main board is located between the first power connector and the base. When the first power connector slides to a second position, the first power connector is located in the frame.

In an embodiment of the disclosure, the frame is a U-shaped plate.

In an embodiment of the disclosure, when the first power connector is located at the first position, the first power connector stops the edge portion of the main board moving away from the base along a first direction, and when the first power connector is located at the second position, the main board moves away from the base along the first direction.

In an embodiment of the disclosure, the first power connector is slidably disposed on the frame along a second direction, and the first direction is perpendicular to the second direction.

In an embodiment of the disclosure, the server further comprises a fan module. The fan module is disposed on the base and stops the main board moving away from the frame along a second direction, and the first direction is perpendicular to the second direction.

In an embodiment of the disclosure, the power supply module further comprises an elastic component connected between the frame and the first power connector, wherein when the first power connector is located at the first position, the elastic component stores an elastic potential, and the first power connector slides to the second position via elastic force of the elastic component.

In an embodiment of the disclosure, the frame has a front end and a back end opposite to each other. The front end is adjacent to the edge portion of the main board. When a power plug is plugged in the first power connector from the back end of the frame, the power plug resists the elastic force of the elastic component and pushes the first power connector, such that the first power connector protrudes from the front end of the frame and arrives to the firs position. When the power plug is disconnected from the first power connector, the first power connector returns back to the second position via the elastic force of the elastic component.

In an embodiment of the disclosure, the first power connector comprises a circuit board and a power socket. The circuit board is slidably disposed on the frame, and the power socket is disposed on the circuit board.

In an embodiment of the disclosure, the power supply module further comprises a second power connector disposed at the edge portion of the main board, wherein the second power connector is a main power connector and the first power connector is a backup power connector.

In an embodiment of the disclosure, the power supply module further comprises a partition plate disposed in the frame, wherein the frame has a convex hull, a sliding slot is formed between the convex hull and the partition plate, and the first power connector is slidably disposed in the sliding slot.

In an embodiment of the disclosure, the first power connector has a first stopping protrusion portion and a second stopping protrusion portion. When the first power connector slides to the first position, the first stopping protrusion portion contacts with the convex hull to position the first power connector at the first position. When the first power connector slides to the second position, the second stopping protrusion portion contacts with the frame to position the first power connector at the second position.

In summary, the first power connector of the disclosure is disposed in the frame of the power supply module in a slidably disposed way, such that the first power connector slides along the frame and protrudes from the frame so as to supply powers, or the first power connector can slide along the frame and move into the frame. When a user tries to dissemble the main board, the user can move the first power connector into the frame, so as to prevent the first power connector protruded from the frame from interfering with the edge portion of the main board that causes problems when dissembling the main board. Therefore, the main board can be dissembled smoothly without dissembling the first power connector of the power supply module or other components of the server, so as to enhance convenience for reworking and maintaining the main board.

In order to make the above features and advantages of the disclosure more comprehensible, several embodiments accompanied with figures are described in detail below.

DETAILED DESCRIPTION OF THE EMBODIMENTS

Figure 1:
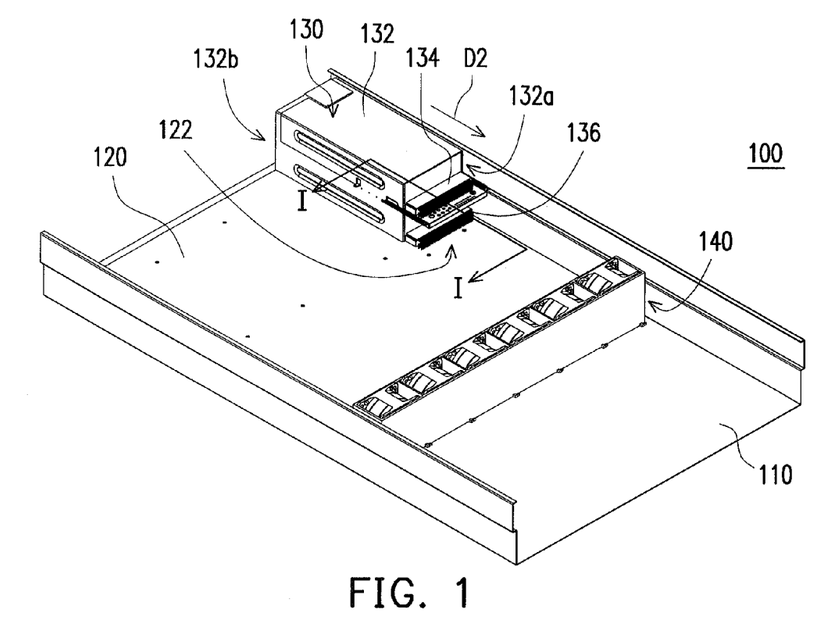
FIG. 1 illustrates a perspective view of some components of a server according to an embodiment of the disclosure.

FIG. 1 illustrates a perspective view of some components of a server according to an embodiment of the disclosure. Referring to FIG. 1. A server 100 of the present embodiment includes a base 110, a main board 120 and a power supply module 130. The main board 120 is disposed on the base 110. The power supply module 130 includes a frame 132, a first power connector 134 and a second power connector 136. The frame 132 of the power supply module 130 is a U-shaped plate disposed on the based 110 and adjacent to an edge portion 122 of the main board 120. The second power connector 136, for example, is a main power connector of the server 100 and is disposed at the edge portion 122 of the main board 120. The first power connector 134, for example, is a backup power connector of the server 100 and is slidably disposed on the frame 132.

Figure 2:
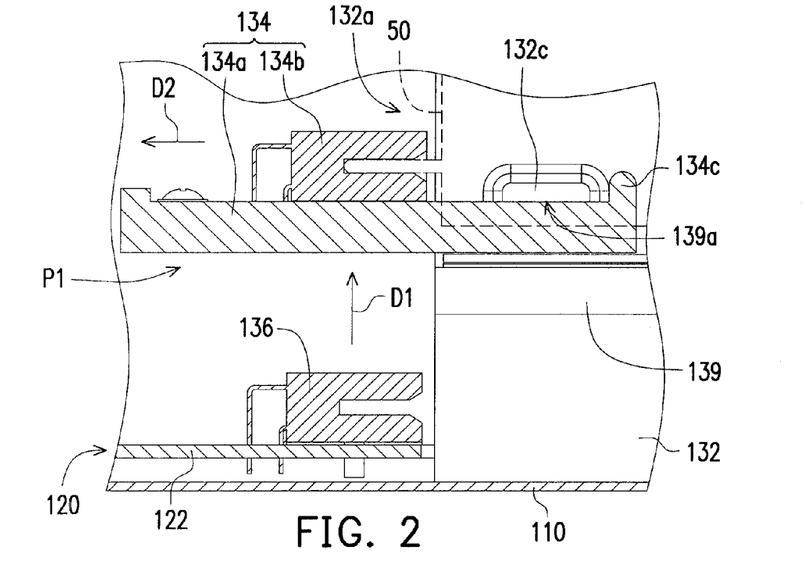
FIG. 2 is a cross-sectional view of a portion of the server depicted in FIG. 1 along a line I-I.
Figure 3:
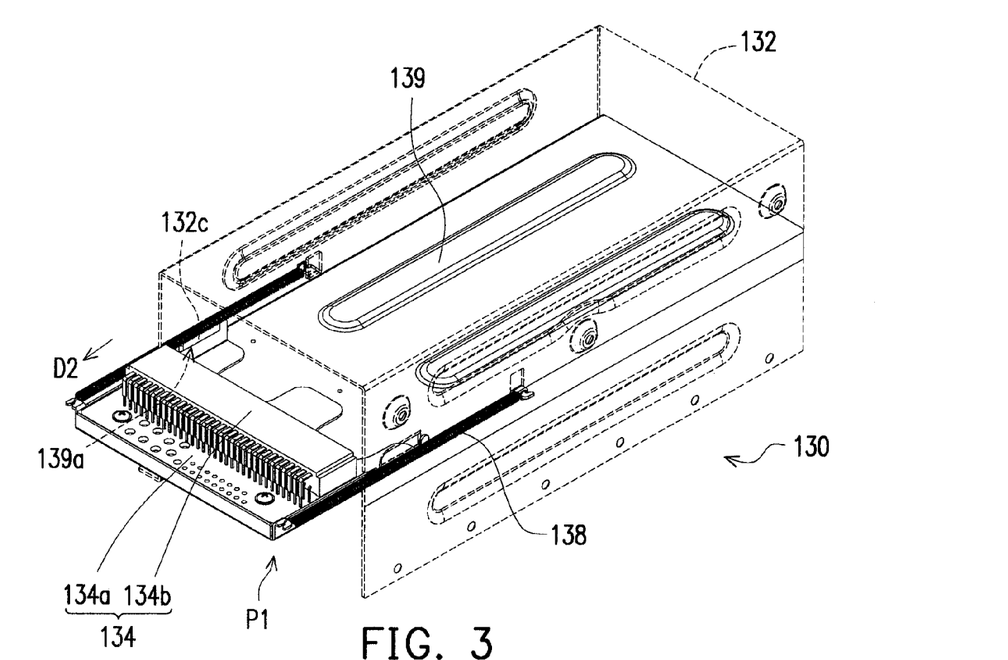
FIG. 3 is a perspective view of the power supply module of FIG. 1.
Figure 4:
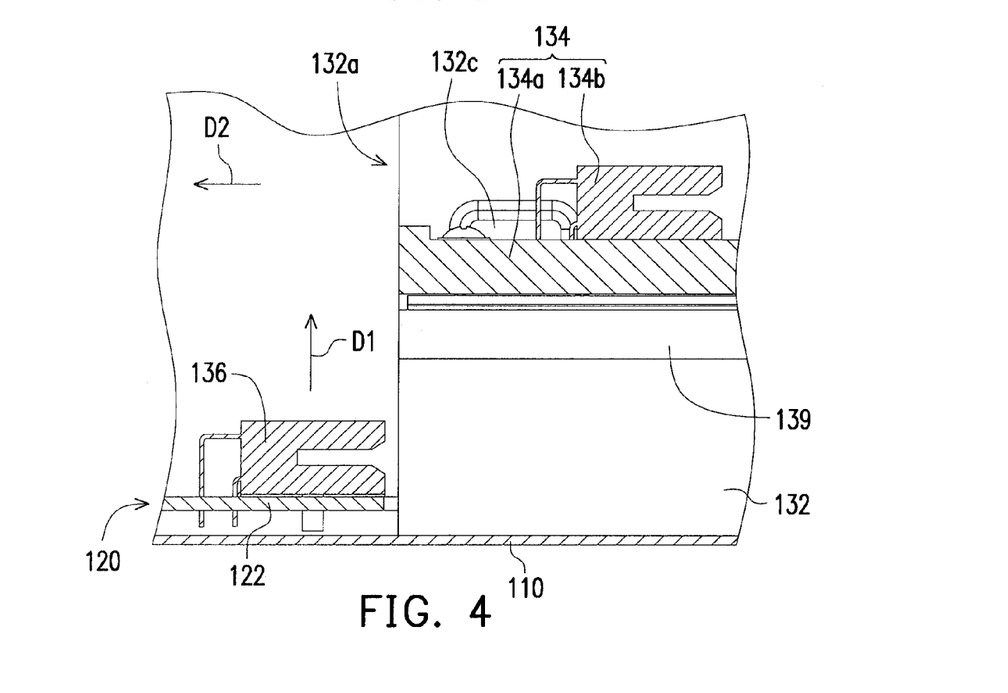
FIG. 4 and FIG. 5 are schematic views of a first power connector sliding into the frame depicted in FIG. 2 and FIG. 3, respectively.
Figure 5:
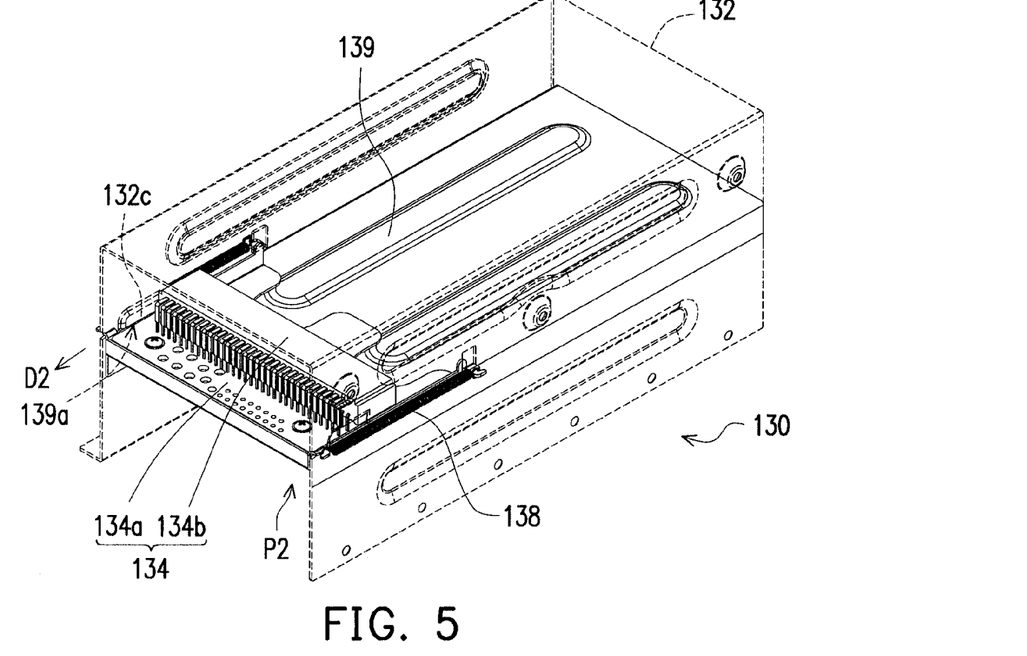

FIG. 2 is a cross-sectional view of a portion of the server depicted in FIG. 1 along a line I-I. FIG. 3 is a perspective view of the power supply module of FIG. 1. FIG. 4 and FIG. 5 are schematic views of a first power connector sliding into the frame depicted in FIG. 2 and FIG. 3, respectively. In order to make the figures more clearly illustrated, the frame shown in FIG. 3 and FIG. 5 is illustrated in a perspective manner. When the first power connector 134 slides to a first position P1, as shown in FIG. 3, the first power connector 134 protrudes from the frame 132 and the edge portion 122 of the main board 120 is located between the first power connector 134 and the base 110 (Referring to FIG. 3). For the time being, the first power connector 134 is located above the main board 120 and stops the edge portion 122 of the main board 120 moving away from the base 110 along a first direction D 1. In other words, in a situation that the first power connector 134 is located at the first position P1, if a user tries to dissemble the main board 120 along the first direction D1, the first power connector 134 stops the main board 120, and therefore dissembling the main board 120 cannot be performed.

Figure 6:
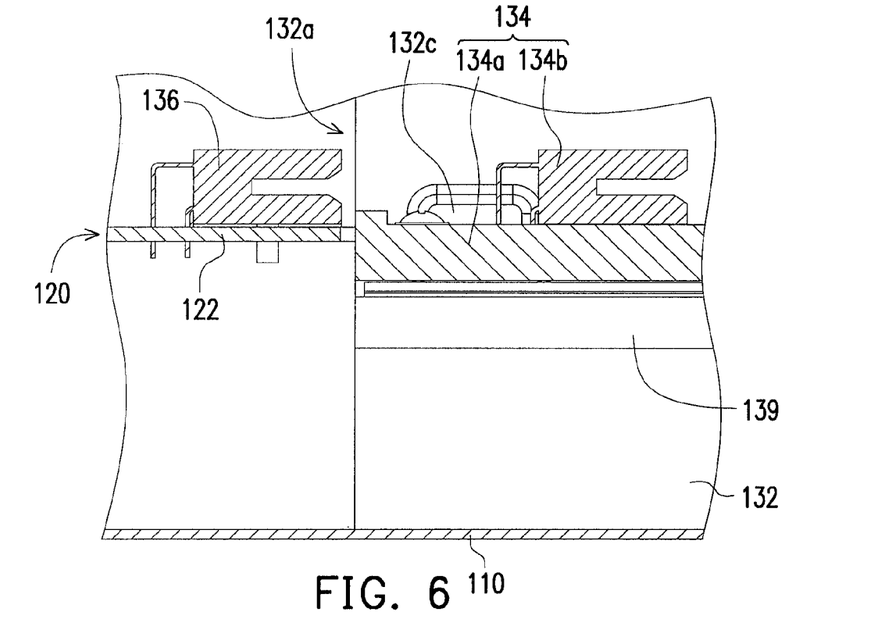
FIG. 6 is a schematic view of dissembling the main board depicted in FIG. 4 along a first direction.

FIG. 6 is a schematic view of dissembling the main board depicted in FIG. 4 along the first direction. When the first power connector 134 slides to a second position P2, as shown in FIG. 4 and FIG. 5, the first power connector 134 is located in the frame 132. For the time being, the first power connector 134 does no longer block the main board 120 on the top, such that the main board 120 moves away from the base 110 along the first direction D1, as shown in FIG. 6. Accordingly, when the user tries to dissemble the main board 120, the user can move the first power connector 134 to the second position P2 for the first power connector 134 to be located in the frame 132, so as to prevent the first power connector 134 protruded from the frame 132 from interfering with the edge portion 122 of the main board 120 that causes problems when dissembling the main board 120. Therefore, the main board 120 can be dissembled smoothly without dissembling the first power connector 134 of the power supply module 130 or other components of the server 100, so as to enhance convenience for reworking and maintaining the main board 120.

Figure 7:
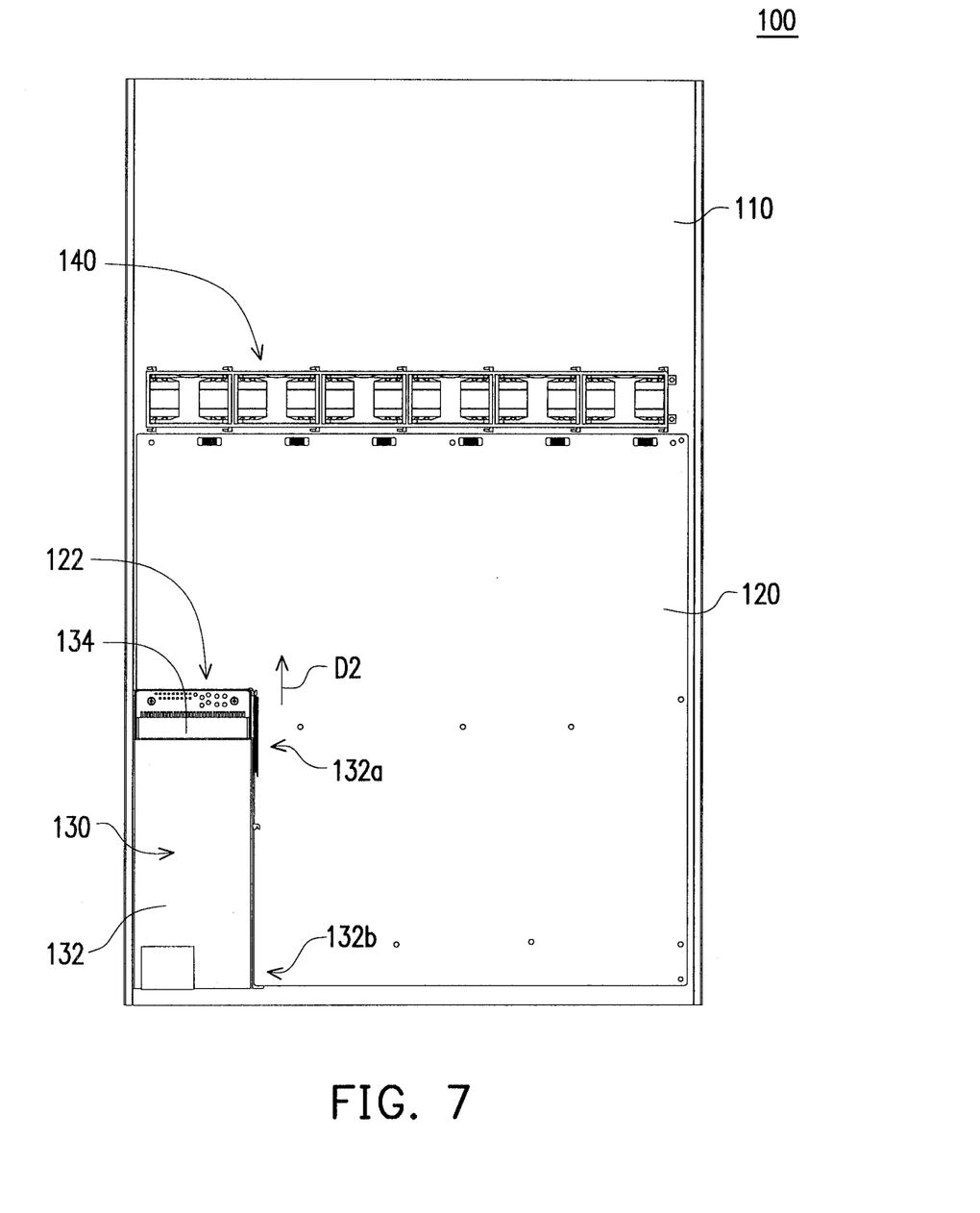
FIG. 7 is a top view of the server of FIG. 1.

In the present embodiment, the first power connector 134, for example, is slidably disposed on the frame 132 along a second direction D2 that is perpendicular to the first direction D1, and is capable of sliding along the frame 132 so as to be located on top of the main board 120, as shown in FIG. 2, or to move away from the top of the main board 120, as shown in FIG. 4. FIG. 7 is a top view of the server of FIG. 1. Referring to FIG. 1 and FIG. 7. The server 100 of the present embodiment further includes a fan module 140. The fan module 140 is disposed on the base 110 to dissipate heat generated by the server 100. Since the first power connector 134 of the present embodiment can slide to the second position P2, as shown in FIG. 4, and move away from the top of the main board 120, the main board 120 can still be dissembled along the first direction D1 even when the fan module 140 stops the main board 120 moving along the second direction D2, as shown in FIG. 1 and FIG. 7. Accordingly, the fan module 140 is designed to be detachable so that the main board 120 does not need to be detachable. Therefore, a configuration of components in the server 100 is simpler, and manufacturing and assembling costs are reduced.

Figure 8:
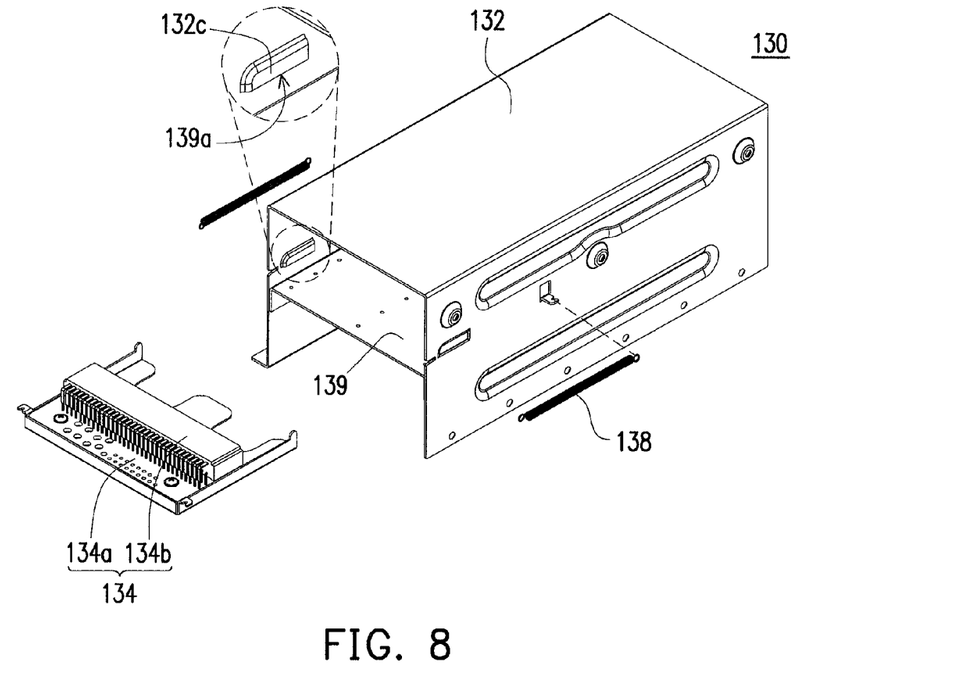
FIG. 8 is an exploded view of some components of the power supply module of FIG. 1.

A detailed description is provided below to explain how the first power connector 134 slides along the frame 132. FIG. 8 is an exploded view of some components of the power supply module of FIG. 1. Referring to FIG. 3 and FIG. 8. In the present embodiment, the power supply module 130 further includes an elastic component 138 (two are illustrated). The elastic component 138, for example, is a tension spring and connected between the frame 132 and the first power connector 134. When the first power connector 134 is located at the first position P1, as shown in FIG. 2 and FIG. 3, the elastic component 138 is stretched and stores elastic potential. When the elastic component 138 releases the elastic potential, the first power connector 134 slides to the second position P2 via elastic force of the elastic component 138, as shown in FIG. 4 and FIG. 5.

Furthermore, the frame 132 has a front end 132a and a back end 132b opposite to each other, as shown in FIG. 1 and FIG. 7, and the front end 132a is adjacent to the edge portion 122 of the main board 120. When an external force is not applied to the first power connector 134, the elastic component 138 is not stretched, and the first power connector 134 is located at the second position P2 and hidden in the frame 132, as shown in FIG. 4 and FIG. 5. When an external power plug 50 (illustrated in FIG. 2) is plugged in the first power connector 134 from the back end 132b of the frame 132, the power plug 50 resists the elastic force of the elastic component 138 and pushes the first power connector 134 to a state as shown in FIG. 2, such that the first power connector 134 protrudes from the front end 132a of the frame 132 and arrives to the first position P1 so as to supply powers to the server 100. When the power plug 50 is disconnected from the first power connector 134, the first power connector 134 does not receive forces from the power plug 50 and returns to the second position P2 via the elastic force of the elastic component 138, as shown in FIG. 4 and FIG. 5, and moves away from the top of the main board 120, such that the main board 120 can be dissembled along the first direction D1. In a process of disconnecting the power plug 50, the first power connector 134 returns to the second position P2 via the elastic force of the elastic component 138. Furthermore, the first power connector 134 can be moved toward the second position P2 via a friction force between the power plug 50 and the first power connector 134.

Figure 9:
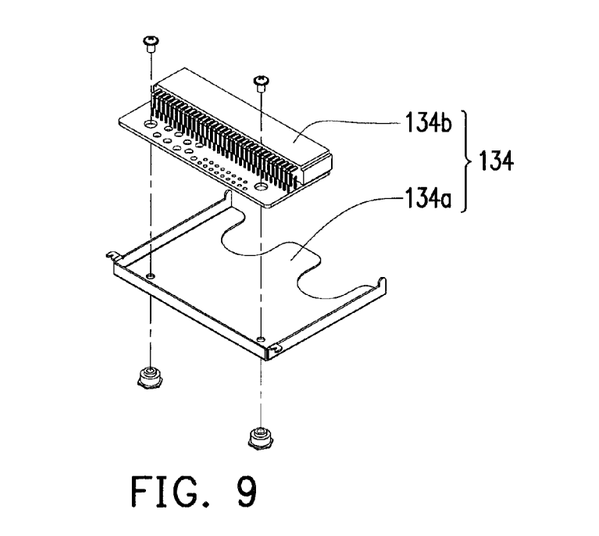
FIG. 9 is an exploded view of a first power connector of FIG. 8.
Figure 10:
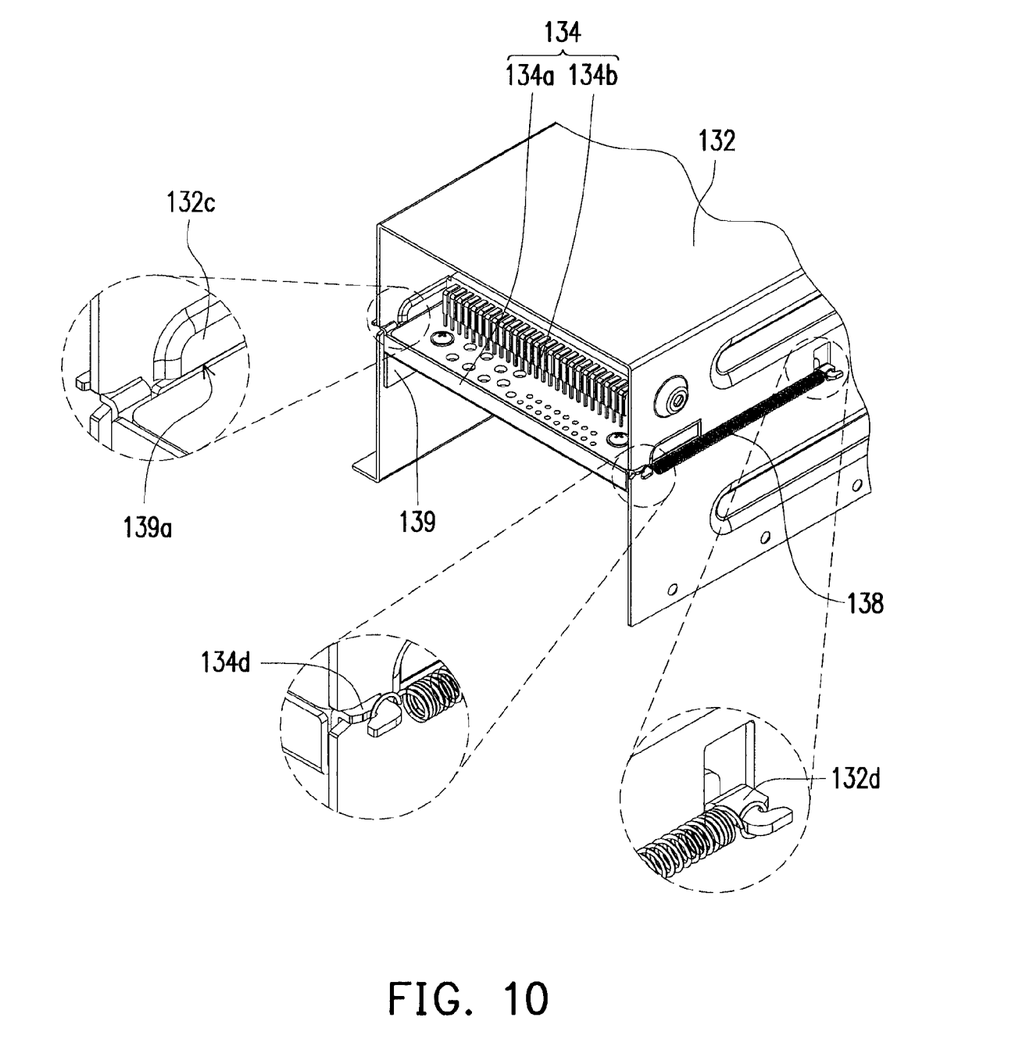
FIG. 10 is a partial perspective view of the power supply module of FIG. 1.

FIG. 9 is an exploded view of the first power connector of FIG. 8. FIG. 10 is a partial perspective view of the power supply module of FIG. 1. Referring to FIG. 8 and FIG. 10. The first power connector 134 of the present embodiment includes a circuit board 134a and a power socket 134b. The circuit board 134a is slidably disposed on the frame 132, and the power socket 134b is disposed on the circuit board 134a and slides with the circuit board 134a along the frame 132. Specifically speaking, the power supply module 130 further includes a partition plate 139. The partition plate 139 is disposed in the frame 132. The frame 132 has two convex hulls 132c on both sides thereof (two are illustrated in FIG. 3 and FIG. 5). The convex hulls are manufactured to the frame 132 in a stamping process. A sliding slot 139a is formed between each convex hull 132c and a side of the partition plate 139, and the circuit board 134a of the first power connector 134 is slidably disposed in the sliding slot 139a, such that the first power connector 134 slides between the first position P1, as shown in FIGS. 2 and 3, and the second position P2, as shown in FIGS. 4 and 5, along the sliding slot 139a.

Referring to FIG. 2. In the present embodiment, the first power connector 134 has a first stopping protrusion portion 134c. When the first power connector 134 slides to the first position P1, as shown in FIG. 2, the first stopping protrusion portion 134c contacts with the convex hull 132c in the frame 132 to position the first power connector 134 at the first position P1 so as to prevent the first power connector 134 from disengaging the frame 132. In addition, referring to FIG. 10. The first power connector 134 further has a second stopping protrusion portion 134d. When the first power connector 134 slides to the second position P2, as shown in FIG. 10, the second stopping protrusion portion 134d contacts with the frame 132 to position the first power connector 134 at the second position P2. In the present embodiment, the second stopping protrusion portion 134d has functions of positioning the first power connector 134 as described above. Furthermore, as shown in FIG. 10, the second stopping protrusion portion 134d is used to connect with one end of the elastic component 138 and the other end of the elastic component 138 connects with a connecting portion 132d on the frame 132, such that the elastic component 138 can be stretched with a movement of the first power connector 134 along the frame 132.

In summary, the first power connector of the disclosure is disposed at the frame of the power supply module in a slidably disposed way, such that the first power connector can slide along the frame and protrudes from the frame so as to supply powers, or the first power connector can move along the frame and move into the frame. When a user tries to dissemble the main board, the user can move the first power connector into the frame, so as to prevent the first power connector protruded from the frame from interfering with the edge portion of the main board that causes problems when dissembling the main board. Therefore, the main board can be dissembled smoothly without dissembling the first power connector of the power supply module or other components of the server, so as to enhance convenience for reworking and maintaining the main board. In addition, when an external power plug is plug in the first power connector and move the first power connector to protrude from the frame, the elastic component connected between the frame and the first power connector stores an elastic potential. Accordingly, when the power plug is disconnected from the first power connector, the first power connector automatically returns into the frame via the elastic force of the elastic component, so as to enhance convenience in terms of using the power supply module.

Although the disclosure has been disclosed by the above embodiments, they are not intended to limit the disclosure. It will be apparent to people of ordinary skill in the art that modifications and variations to the structure of the disclosed embodiments may be made without departing from the spirit and the scope of the disclosure. Accordingly, the protection scope of the disclosure falls in the appended claims.

What is claimed is:

1. A power supply module, configured for a server, wherein the server comprises a base and a main board, the main board is disposed on the base, the power supply module comprises:
   a frame, disposed on the base and adjacent to an edge portion of the main board; and
   a first power connector, slidably disposed on the frame, wherein when the first power connector slides to a first position, the first power connector protrudes from the frame and the edge portion of the main board is located between the first power connector and the base, and when the first power connector slides to a second position, the first power connector is located in the frame.

2. The power supply module as recited in claim 1, wherein the frame is a U-shaped plate.

3. The power supply module as recited in claim 1, wherein when the first power connector is located at the first position, the first power connector stops the edge portion of the main board moving away from the base along a first direction, and when the first power connector is located at the second position, the main board moves away from the base along the first direction.

4. The power supply module as recited in claim 3, wherein the first power connector is slidably disposed on the frame along a second direction, and the first direction is perpendicular to the second direction.

5. The power supply module as recited in claim 3, wherein the server further comprises a fan module, the fan module is disposed on the base and stops the main board moving away from the frame along a second direction, and the first direction is perpendicular to the second direction.

6. The power supply module as recited in claim 1, further comprising an elastic component connected between the frame and the first power connector, wherein when the first power connector is located at the first position, the elastic component stores an elastic potential, and the first power connector slides to the second position via elastic force of the elastic component.

7. The power supply module as recited in claim 6, wherein the frame has a front end and a back end opposite to each other, the front end is adjacent to the edge portion of the main board, when a power plug is plugged in the first power connector from the back end of the frame, the power plug resists the elastic force of the elastic component and pushes the first power connector, such that the first power connector protrudes from the front end of the frame and arrives to the firs position, and when the power plug is disconnected from the first power connector, the first power connector returns back to the second position via the elastic force of the elastic component.

8. The power supply module as recited in claim 1, wherein the first power connector comprises a circuit board and a power socket, the circuit board is slidably disposed on the frame, and the power socket is disposed on the circuit board.

9. The power supply module as recited in claim 1, further comprising a second power connector, disposed at the edge portion of the main board, wherein the second power connector is a main power connector and the first power connector is a backup power connector.

10. The power supply module as recited in claim 1, further comprising a partition plate disposed in the frame, wherein the frame has a convex hull, a sliding slot is formed between the convex hull and the partition plate, and the first power connector is slidably disposed in the sliding slot.

11. The power supply module as recited in claim 10, wherein the first power connector has a first stopping protrusion portion and a second stopping protrusion portion, when the first power connector slides to the first position, the first stopping protrusion portion contacts with the convex hull to position the first power connector at the first position, and when the first power connector slides to the second position, the second stopping protrusion portion contacts with the frame to position the first power connector at the second position.

12. A server, comprising:
a base;
a main board, disposed on the base; and
a power supply module, comprising:
a frame, disposed on the base and adjacent to an edge portion of the main board; and
a first power connector, slidably disposed on the frame, wherein when the first power connector slides to a first position, the first power connector protrudes from the frame and the edge portion of the main board is located between the first power connector and the base, and when the first power connector slides to a second position, the first power connector is located in the frame.

13. The server as recited in claim 12, wherein when the first power connector is located at the first position, the first power connector stops the edge portion of the main board moving away from the base along a first direction, and when the first power connector is located at the second position, the main board moves away from the base along the first direction.

14. The server as recited in claim 13, wherein the first power connector is slidably disposed on the frame along a second direction, and the first direction is perpendicular to the second direction.

15. The server as recited in claim 13, further comprising a fan module, wherein the fan module is disposed on the base and stops the main board moving away from the frame along a second direction, and the first direction is perpendicular to the second direction.

16. The server as recited in claim 12, wherein the power supply module further comprises a elastic component connected between the frame and the first power connector, wherein when the first power connector is located at the first position, the elastic component stores an elastic potential, and the first power connector slides to the second position via elastic force of the elastic component.

17. The server as recited in claim 16, wherein the frame has a front end and a back end opposite to each other, the front end is adjacent to the edge portion of the main board, when a power plug is plugged in the first power connector from the back end of the frame, the power plug resists the elastic force of the elastic component and pushes the first power connector, such that the first power connector protrudes from the front end of the frame and arrives to the firs position, and when the power plug is disconnected from the first power connector, the first power connector returns back to the second position via the elastic force of the elastic component.

18. The server as recited in claim 12, wherein the first power connector comprises a circuit board and a power socket, the circuit board is slidably disposed on the frame, and the power socket is disposed on the circuit board.

19. The server as recited in claim 12, wherein the power supply module further comprises a second power connector disposed at the edge portion of the main board, wherein the second power connector is a main power connector and the first power connector is a backup power connector.

20. The server as recited in claim 12, wherein the power supply module further comprises a partition plate disposed in the frame, wherein the frame has a convex hull, a sliding slot is formed between the convex hull and the partition plate, and the first power connector is slidably disposed in the sliding slot.

21. The server as recited in claim 20, wherein the first power connector has a first stopping protrusion portion and a second stopping protrusion portion, when the first power connector slides to the first position, the first stopping protrusion portion contacts with the convex hull to position the first power connector at the first position, and when the first power connector slides to the second position, the second stopping protrusion portion contacts with the frame to position the first power connector at the second position.

* * * * *